US012757512B2

(12) United States Patent
Yi et al.

(10) Patent No.: US 12,757,512 B2
(45) Date of Patent: Oct. 6, 2026

(54) STRUCTURES INCLUDING A PHOTODETECTOR AND MULTIPLE DEEP TRENCHES

(71) Applicant: GlobalFoundries Singapore Pte. Ltd., Singapore (SG)

(72) Inventors: Wanbing Yi, Singapore (SG); Yong Chau Ng, Singapore (SG); Xiaodong Li, Singapore (SG); Weichu Qiu, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 388 days.

(21) Appl. No.: 18/432,229

(22) Filed: Feb. 5, 2024

(65) Prior Publication Data

US 2025/0255023 A1 Aug. 7, 2025

(51) Int. Cl.
*H10F 39/00* (2025.01)
*H10F 39/18* (2025.01)

(52) U.S. Cl.
CPC ......... *H10F 39/807* (2025.01); *H10F 39/011* (2025.01); *H10F 39/811* (2025.01)

(58) Field of Classification Search
CPC ..................................................... H10F 39/807
See application file for complete search history.

(56) References Cited

U.S. PATENT DOCUMENTS

| | | | | |
|---|---|---|---|---|
| 10,580,817 | B2 | 3/2020 | Otake et al. | |
| 2018/0090526 | A1 | 3/2018 | Mandai et al. | |
| 2020/0135798 | A1 | 4/2020 | Tsao et al. | |
| 2021/0043593 | A1 | 2/2021 | Huang et al. | |
| 2021/0166976 | A1* | 6/2021 | Choi | H10P 95/064 |
| 2023/0065063 | A1 | 3/2023 | Zheng et al. | |
| 2023/0094219 | A1* | 3/2023 | Takatsuka | H10F 39/803 257/292 |
| 2023/0131505 | A1* | 4/2023 | Linardy | H10F 39/011 257/432 |
| 2025/0022900 | A1* | 1/2025 | Kim | H10F 39/011 |

OTHER PUBLICATIONS

K. Ito et al., "A Back Illuminated 10 μm SPAD Pixel Array Comprising Full Trench Isolation and Cu—Cu Bonding with Over 14% PDE at 940nm," 2020 IEEE International Electron Devices Meeting (IEDM), San Francisco, CA, USA, 2020, pp. 16.6.1-16.6.4, doi: 10.1109/IEDM13553.2020.9371944.

(Continued)

*Primary Examiner* — Antonio B Crite
(74) *Attorney, Agent, or Firm* — Thompson Hine LLP; Anthony Canale

(57) ABSTRACT

Structures including a photodetector, such as a single-photon avalanche diode, and related methods. The structure comprises a semiconductor layer, a photodetector including a well in the semiconductor layer, and a deep trench isolation region including a first conductor layer extending through the semiconductor layer. The deep trench isolation region surrounds the photodetector. The structure further comprises a bond pad, and an electrical connection including a second conductor layer extending from the bond pad through the semiconductor layer.

20 Claims, 7 Drawing Sheets

(56) References Cited

OTHER PUBLICATIONS

Yu Zou, D. Bronzi, F. Villa and S. Weyers, “Backside illuminated wafer-to-wafer bonding single photon avalanche diode array,” 2014 10th Conference on Ph.D. Research in Microelectronics and Electronics (PRIME), Grenoble, 2014, pp. 1-4, doi: 10.1109/PRIME.2014.6872751.

European Patent Office, Extended European Search Report and Opinion issued in European Patent Application No. 24189048.2 on Dec. 18, 2024; 8 pages.

* cited by examiner

STRUCTURES INCLUDING A PHOTODETECTOR AND MULTIPLE DEEP TRENCHES

BACKGROUND

The present disclosure relates to semiconductor device fabrication and integrated circuits and, more specifically, to structures including a photodetector, such as a single-photon avalanche diode, and related methods.

A single-photon avalanche diode (SPAD) is a type of solid-state photodetector belonging to the same family as photodiodes and avalanche photodiodes. A fundamental difference between single-photon avalanche diodes and other types of photodetectors is that a single-photon avalanche diode is biased well above its reverse-bias breakdown voltage. When a single-photon avalanche diode is placed under such a high reverse bias, photon-initiated charge carriers are accelerated by the electric field to a kinetic energy that is large enough to knock electrons out of atoms of the bulk material and generate additional charge carriers that may exponentially grow to generate an avalanche of charge carriers. A single-photon avalanche diode can detect single photons providing short duration current pulses that can be counted or used to obtain a time of arrival of a particular incident single photon.

Processes for fabricating a single-photon avalanche diode are subject to certain limitations. For example, a backside-illuminated single-photon avalanche diode requires the formation of deep trenches to form deep trench isolation regions and bond pad openings to form connections to bond pads. Tungsten fill for the deep trench isolation regions requires an etch that is incompatible with conventional complementary-metal-oxide-semiconductor processes. Aluminum fill inside the bond pad openings suffers from poor gapfill.

Improved structures including a photodetector, such as a single-photon avalanche diode, and related methods are needed.

SUMMARY

In an embodiment of the invention, a structure comprises a semiconductor layer, a photodetector including a well in the semiconductor layer, and a deep trench isolation region including a first conductor layer extending through the semiconductor layer. The deep trench isolation region surrounds the photodetector. The structure further comprises a bond pad, and an electrical connection including a second conductor layer extending from the bond pad through the semiconductor layer.

In an embodiment of the invention, a method comprises forming a photodetector including a well in a semiconductor layer and forming a deep trench isolation region including a first conductor layer extending through the semiconductor layer. The deep trench isolation region surrounds the photodetector. The method further comprises forming an electrical connection including a second conductor layer extending from a bond pad through the semiconductor layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

FIG. 1A is a top view in which FIG. 1 is taken generally along line 1-1.

FIG. 4A is a top view in which FIG. 4 is taken generally along line 4-4.

DETAILED DESCRIPTION

Figure 1:
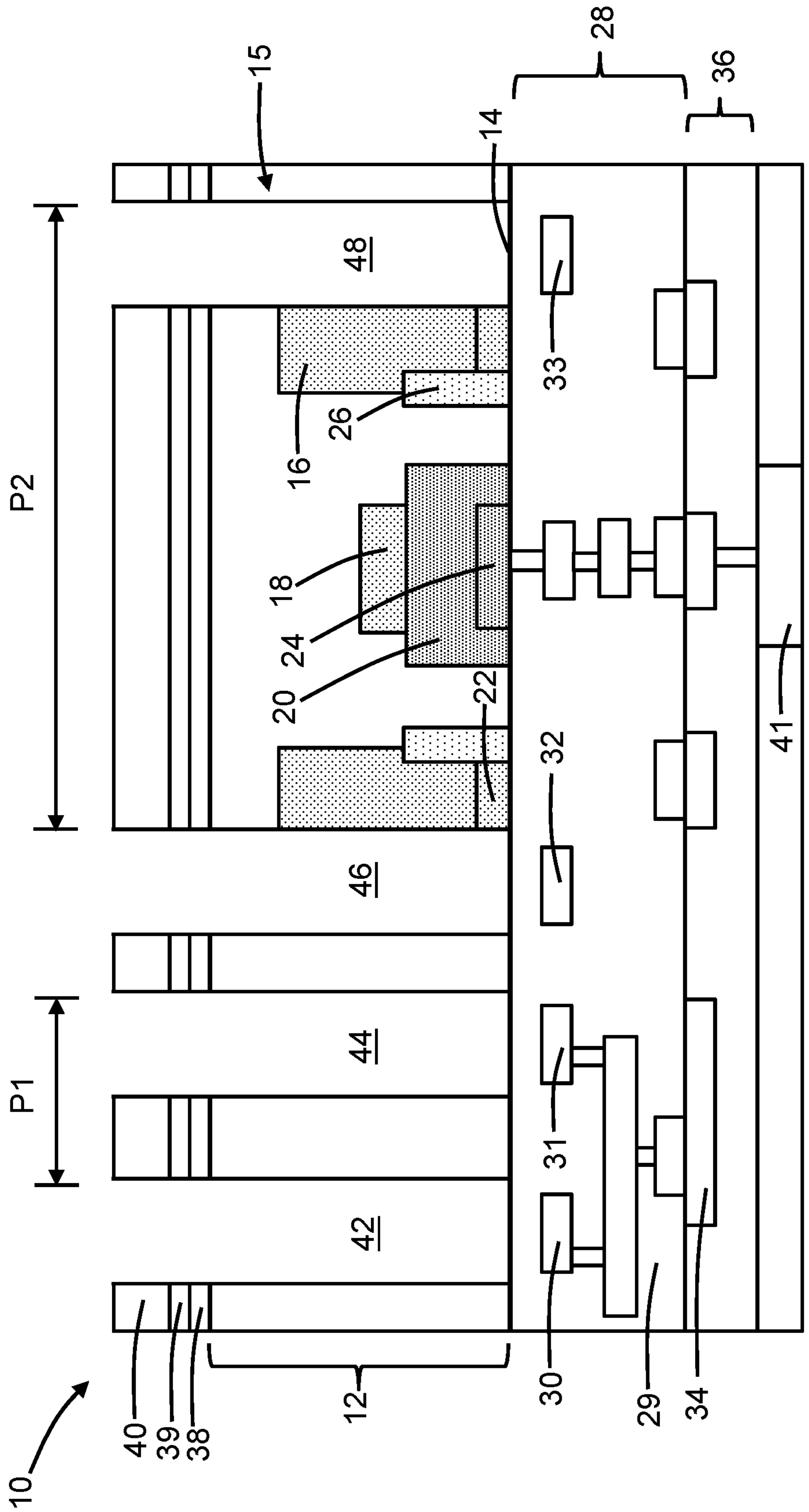
FIG. 1 is a cross-sectional view of a structure at an initial fabrication stage of a processing method in accordance with embodiments of the invention.
Figure 1A:
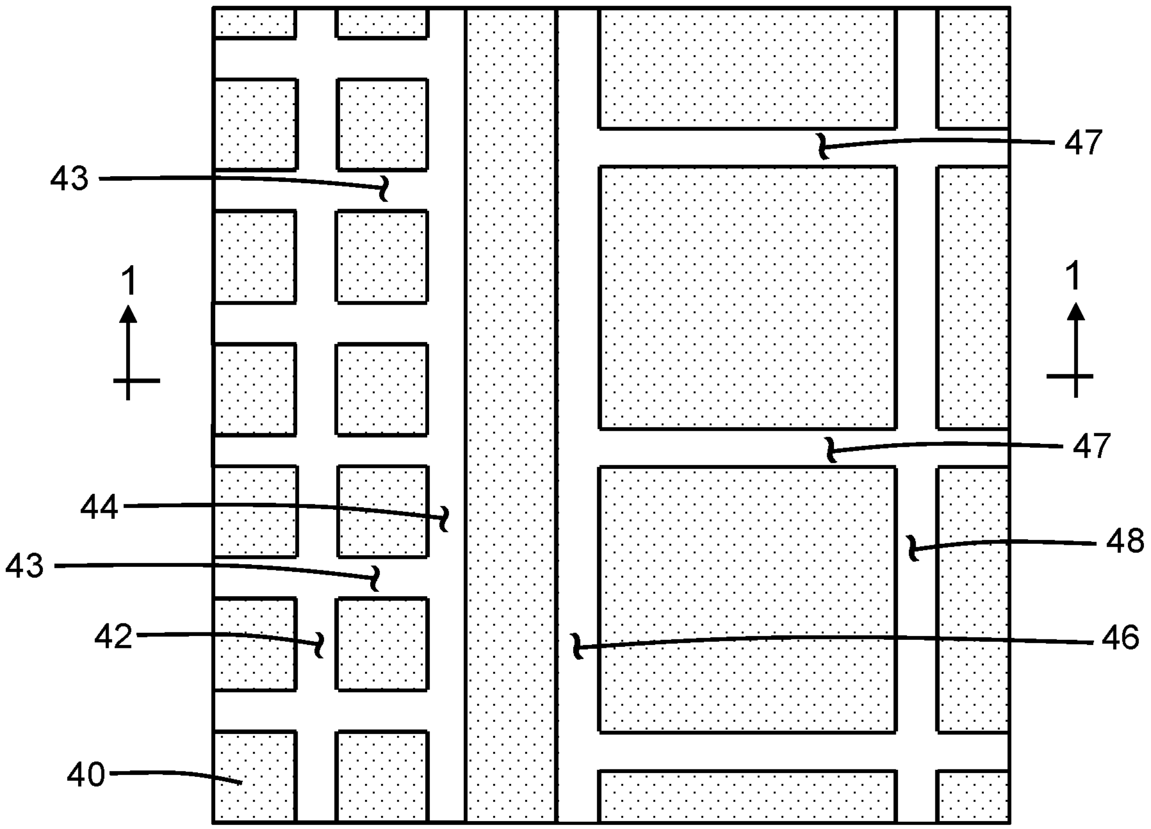

With reference to FIGS. 1, 1A and in accordance with embodiments of the invention, a structure 10 includes a semiconductor layer 12 and a photodetector in the representative form of a single-photon avalanche diode 15. The semiconductor layer 12 may be comprised of a semiconductor material, such as single-crystal silicon. In an embodiment, the semiconductor layer 12 may be comprised of single-crystal silicon that is undoped or intrinsic.

The single-photon avalanche diode 15 includes wells 16, 18, and 20 that are disposed in the semiconductor layer 12 adjacent to a surface 14 of the semiconductor layer 12. In an embodiment, the well 16 may be formed in a peripheral portion of the semiconductor layer 12 and may be ring-shaped to surround a central portion of the semiconductor layer 12. The well 16 may be formed by, for example, an ion implantation process using an implantation mask with an opening that determines the portion of the semiconductor layer 12 targeted to be implanted with ions. The implantation mask may include a layer of photoresist applied by a spin-coating process, pre-baked, exposed to light projected through a photomask, baked after exposure, and developed with a chemical developer to form the opening. The implantation conditions, such as ion species, dose, and kinetic energy, may be selected to tune the electrical and physical characteristics of the well 16. The implantation mask, which has a thickness adequate to stop the ions, may be stripped after forming the well 16. In an embodiment, the semiconductor material of the well 16 may receive and contain a p-type dopant, such as boron, that provides p-type conductivity.

The well 18 may be formed in a central portion of the semiconductor layer 12. The well 18 may be formed by, for example, an ion implantation process using an implantation mask with an opening that determines the portion of the semiconductor layer 12 targeted to be implanted with ions. The implantation mask may include a layer of photoresist applied by a spin-coating process, pre-baked, exposed to light projected through a photomask, baked after exposure, and developed with a chemical developer to form the opening. The implantation conditions, such as ion species, dose, and kinetic energy, may be selected to tune the electrical and physical characteristics of the well 18. The implantation mask, which has a thickness adequate to stop the ions, may be stripped after forming the well 18. In an embodiment, the semiconductor material of the well 18 may receive and contain a p-type dopant, such as boron, that provides p-type conductivity.

The well 20 may be formed in a central portion of the semiconductor layer 12. The well 20 is positioned in a vertical direction between the well 18 and the surface 14 of the semiconductor layer 12. The well 18 and the well 20 are doped to have opposite conductivity types. The well 20 adjoins the well 18 along a p-n junction that, during operation of the single-photon avalanche diode 15, may be reverse biased. The well 20 may be formed by, for example, an ion implantation process using an implantation mask with an opening that determines the portion of the semiconductor layer 12 targeted to be implanted with ions. The implantation mask may include a layer of photoresist applied by a spin-coating process, pre-baked, exposed to light projected through a photomask, baked after exposure, and developed with a chemical developer to form the opening. The implantation conditions, such as ion species, dose, and kinetic energy, may be selected to tune the electrical and physical characteristics of the well 20. The implantation mask, which has a thickness adequate to stop the ions, may be stripped after forming the well 20. In an embodiment, the semiconductor material of the well 20 may receive and contain an n-type dopant, such as arsenic or phosphorus, that provides n-type conductivity.

The single-photon avalanche diode 15 may include a doped region 22 that is formed in a portion of the well 16, and a doped region 24 that is formed in a central portion of the well 20. The doped region 22 may be doped to have the same conductivity type as the well 16 and a higher dopant concentration than the well 16. The doped region 24 may be doped to have the same conductivity type as the well 20 and a higher dopant concentration than the well 20. The doped regions 22, 24 may be formed by respective ion implantation processes with suitable implantation masks.

Shallow trench isolation regions 26 are formed in the semiconductor layer 12. The shallow trench isolation regions 26 may be formed by patterning shallow trenches with lithography and etching processes, depositing a dielectric material, such as silicon dioxide, to fill the shallow trenches, and planarizing and/or recessing the dielectric material. The shallow trench isolation regions 26 may surround the portion of the semiconductor layer 12 including the well 18, the well 20, and the doped region 24 of the single-photon avalanche diode 15.

A back-end-of-line stack 28 is formed adjacent to the surface 14 of the semiconductor layer 12. The back-end-of-line stack 28 includes metallization levels with interlayer dielectric layers 29, metal features 30, 31 that are disposed within the interlayer dielectric layers 29, and metal features 32, 33 that are also disposed within the interlayer dielectric layers 29. Each interlayer dielectric layer 29 may be comprised of dielectric material, such as silicon dioxide or silicon nitride, that is an electrical insulator. In an embodiment, the metal features 30, 31 may be arranged in the same metallization level of the back-end-of-line stack 28 as the metal features 32, 33.

The back-end-of-line stack 28 may be bonded by a suitable process to the back-end-of-line stack 36 of another chip or wafer. The back-end-of-line stack 36 includes metal features 34 that are physically and electrically coupled to the metal features 30, 31 and with other metal features of the back-end-of-line stack 28. However, the metal features 32, 33 of the back-end-of-line stack 28 are electrically isolated and floating within the interlayer dielectric layers 29 of the back-end-of-line stack 28 and are not coupled to other metal features in either the back-end-of-line stack 28 or the back-end-of-line stack 36.

A semiconductor layer 38, an anti-reflection layer 39, and a dielectric layer 40 may be formed on the semiconductor layer 12. The semiconductor layer 38 may be comprised of a semiconductor material, such as silicon, that is doped to have, for example, p-type conductivity. The anti-reflection layer 39 may be comprised of, for example, tantalum oxide. The dielectric layer 40 may be comprised of a dielectric material, such as silicon dioxide, that is an electrical insulator.

Trenches 42, 44 and trenches 46, 48 are formed as openings that penetrate fully through the semiconductor layer 38, the anti-reflection layer 39, and the dielectric layer 40 to the semiconductor layer 12, and that penetrate fully through the semiconductor layer 12. The trenches 42, 44 are respectively aligned with the metal features 30, 31, and the trenches 46, 48 are respectively aligned with the metal features 32, 33. The trenches 42, 44 have sidewalls bordered by the semiconductor layer 12 and the trenches 46, 48 also have sidewalls bordered by the semiconductor layer 12.

In an embodiment, the trench 46 may be connected to the trench 48 by additional trenches 47 such that the connected trenches 46, 48 surround a portion of the semiconductor layer 12 in which the single-photon avalanche diode 15 is formed and other portions of the semiconductor layer 12 in which additional instances of the single-photon avalanche diode 15 may be formed. In particular and as shown in FIG. 1A, the additional trenches 47 may intersect and cross the trenches 46, 48 at various locations in a grid pattern to provide the surrounded portions of the semiconductor layer 12.

In an embodiment, the trench 42 may be connected to the trench 44 by additional trenches 43 such that the connected trenches 42, 44 surround portions of the semiconductor layer 12. In particular and as shown in FIG. 1A, the additional trenches 43 may intersect and cross the trenches 42, 44 at various locations in a grid pattern to provide the surrounded portions of the semiconductor layer 12.

In an embodiment, the trenches 42, 44 and the trenches 46, 48 may be simultaneously formed. In that regard, the trenches 42, 44 and trenches 46, 48 may be patterned in the semiconductor layer 12 by lithography and etching processes. To that end, an etch mask may be formed by a lithography process over the dielectric layer 40. The etch mask may include a layer of a photoresist applied by a spin-coating process, pre-baked, exposed to light projected through a photomask, baked after exposure, and developed with a chemical developer to define openings at the intended locations for the trenches 42, 44 and the trenches 46, 48. An etching process is used to form the trenches 42, 44 and trenches 46, 48 in the semiconductor layer 12 at the locations of the openings in the etch mask. An etch stop layer at the interface between the semiconductor layer 12 and the back-end-of-line stack 28 may prevent the trenches 42, 44 and trenches 46, 48 from penetrating into the back-end-of-line stack 28. In an embodiment, the trenches 42, 44 may be formed with a pitch P1 and the trenches 46, 48 may be formed with a pitch P2 that is greater than the pitch P1.

The formation of the trenches 42, 44 is unified with the formation of the trenches 46, 48 in the process flow. The unification of the formation may reduce the complexity of the process flow by at least one photomask.

Multiple instances of the single-photon avalanche diode 15 may be arranged as pixels in a pixel array to define an image sensor, which may be used in a mobile phone, a digital camera, or another type of electronic device. The structure 10 may be connected to logic circuitry 41 and to one or more power supplies.

Figure 2:
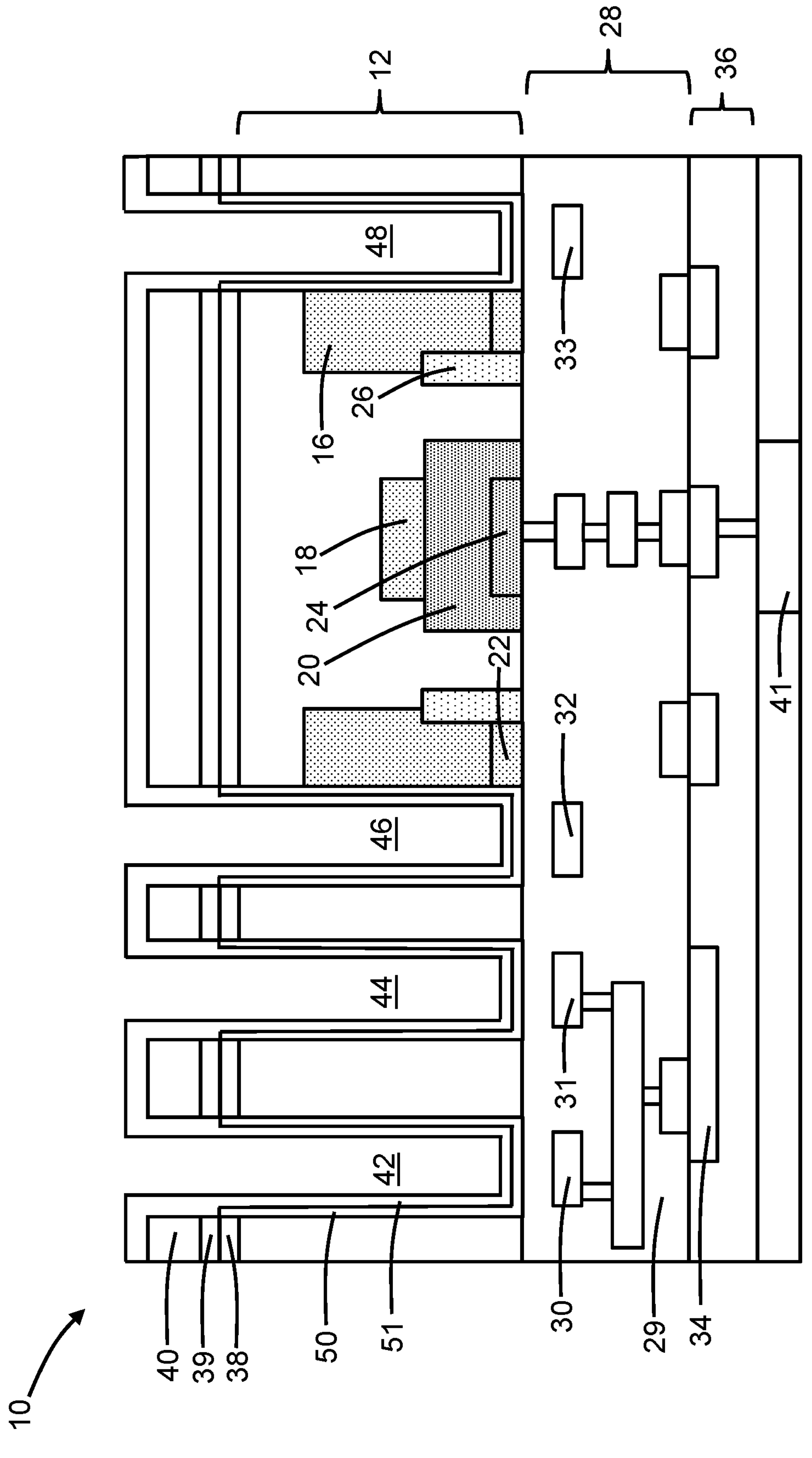
FIG. 2 is a cross-sectional view of the structure at a fabrication stage subsequent to FIG. 1.

With reference to FIG. 2 in which like reference numerals refer to like features in FIG. 1 and at a subsequent fabrication stage of the processing method, a semiconductor layer 50 may be formed on the sidewalls of the trenches 42, 44 and on the sidewalls of the trenches 46, 48. In an embodiment, the semiconductor layer 50 may be formed by an epitaxial growth process. In an embodiment, the semiconductor layer 50 may be comprised of the same semiconductor material as the semiconductor layer 38. In an embodiment, the semiconductor layer 50 may be comprised of a semiconductor material, such as silicon, that is doped to have, for example, p-type conductivity. The semiconductor layer 50 may be connected to the semiconductor layer 38 at the entrances to the trenches 42, 44 and at the entrances to the trenches 46, 48.

A dielectric layer 51 is formed that includes respective portions that coat the semiconductor layer 50 on the sidewalls of the trenches 42, 44 and the sidewalls of the trenches 46, 48. The dielectric layer 51 may be comprised of, for example, silicon dioxide, and may have a conformal thickness on the trench sidewalls. The dielectric layer 51 may also operate to effectively thicken the dielectric layer 40. The trenches 42, 44 and the trenches 46, 48 are narrowed by the addition of the semiconductor layer 50 and the dielectric layer 51. In an embodiment, the dielectric layer 51 may have equal thicknesses on the sidewalls of the trenches 42, 44 and on the sidewalls of the trenches 46, 48. In an embodiment, the dielectric layer 51 may have a thickness of about 150 nanometers. The semiconductor layer 50 on the sidewalls of the trenches 42, 44 and the sidewalls of the trenches 46, 48 is disposed between the dielectric layer 51 and the semiconductor layer 12.

Figure 3:
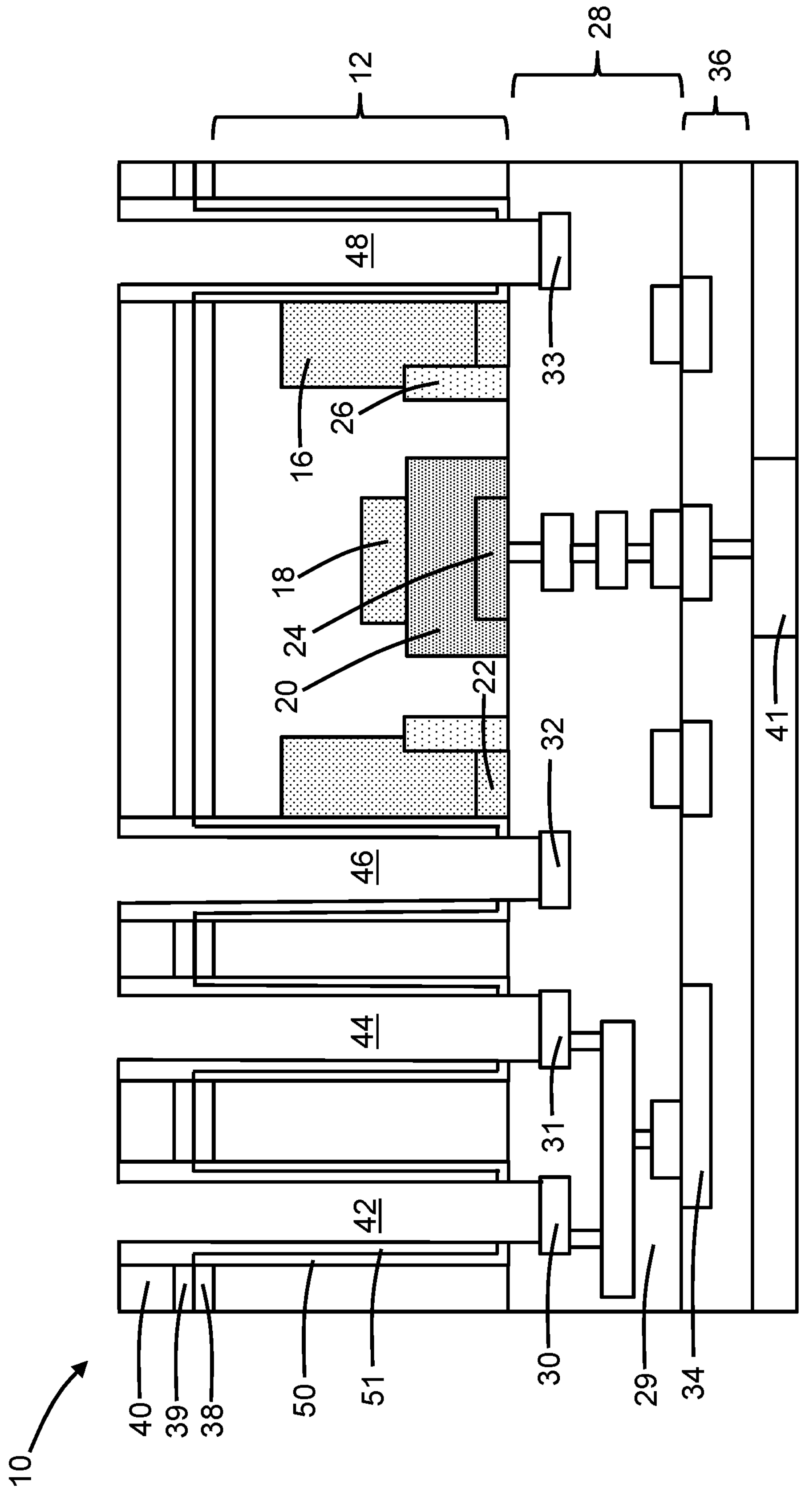
FIG. 3 is a cross-sectional view of the structure at a fabrication stage subsequent to FIG. 2.

With reference to FIG. 3 in which like reference numerals refer to like features in FIG. 2 and at a subsequent fabrication stage of the processing method, one or more etching processes may be performed, after forming the semiconductor layer 50 and the dielectric layer 51, to extend the trenches 42, 44 and the trenches 46, 48 into the back-end-of-line stack 28. The extended trench 42 may terminate at the metal feature 30 and the extended trench 44 may terminate at the metal feature 31. The extended trench 46 may terminate at the metal feature 32 and the extended trench 48 may terminate at the metal feature 33. In an embodiment, the trenches 42, 44 and the trenches 46, 48 may be concurrently extended into the back-end-of-line stack 28 by the one or more etching processes. Each of the trenches 42, 44 includes a section in the semiconductor layer 12 and a section in the back-end-of-line stack 28. Each of the trenches 46, 48 includes a section in the semiconductor layer 12 and a section in the back-end-of-line stack 28.

Figure 4:
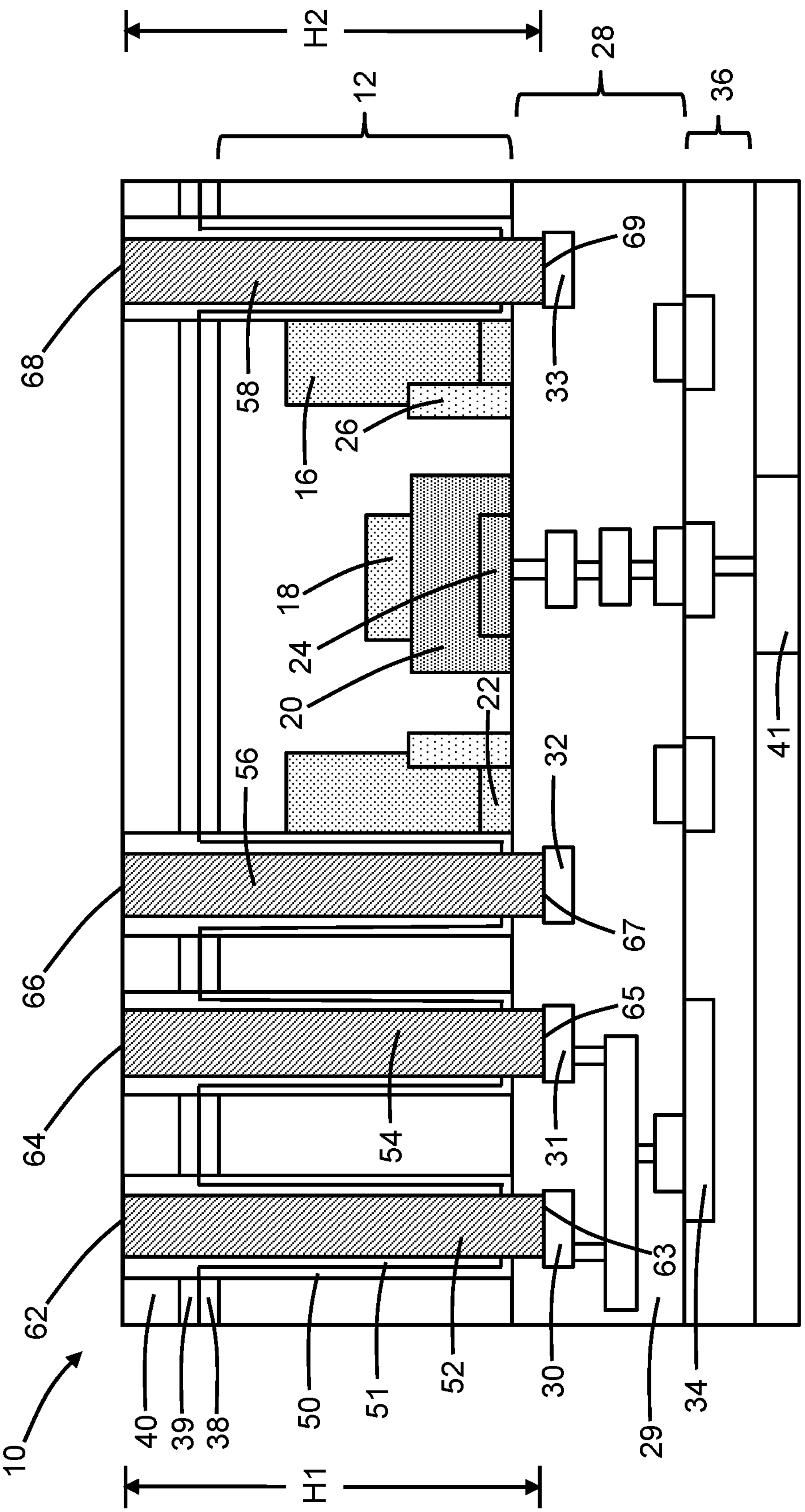
FIG. 4 is a cross-sectional view of the structure at a fabrication stage subsequent to FIG. 3.
Figure 4A:
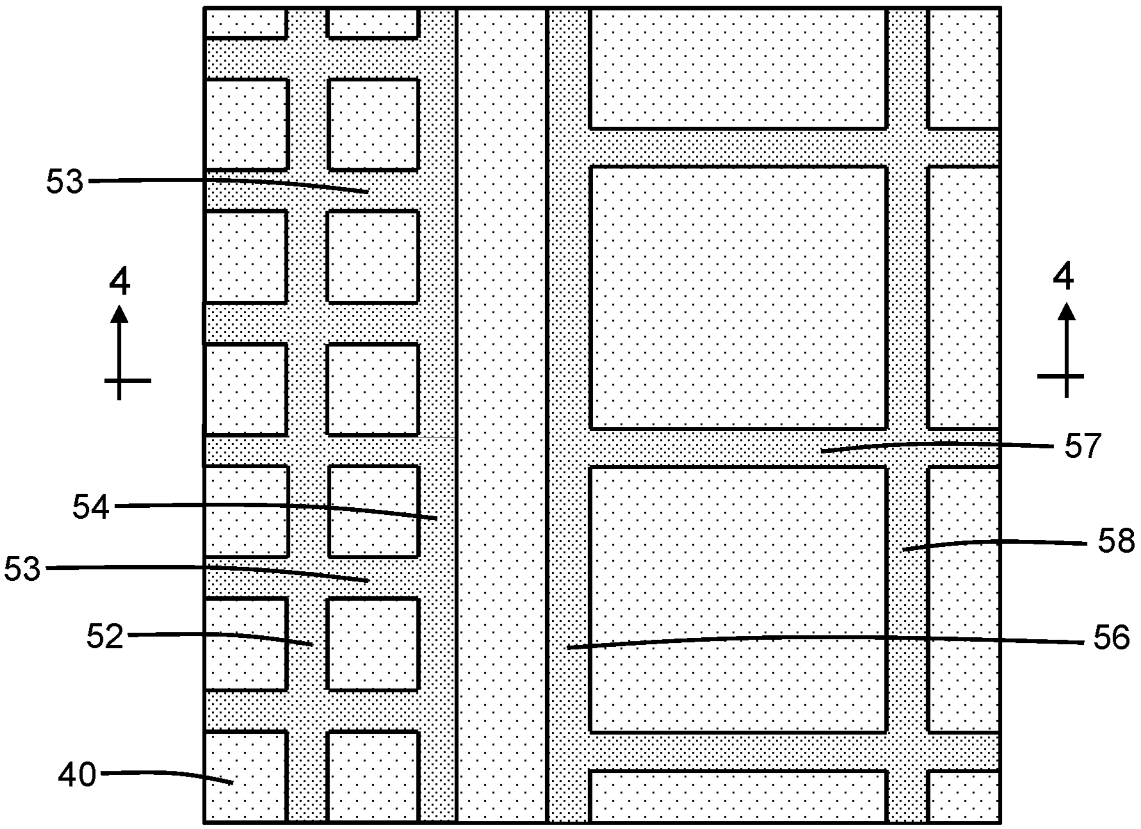

With reference to FIGS. 4, 4A in which like reference numerals refer to like features in FIG. 3 and at a subsequent fabrication stage of the processing method, conductor layers 52, 54 are formed inside the trenches 42, 44 as respective solid cores that are arranged interior of the portions of the dielectric layer 51 on the sidewalls of the trenches 42, 44. The portions of the dielectric layer 51 on the sidewalls of the trenches 42, 44 are disposed between the conductor layers 52, 54 and the semiconductor layer 50 on the sidewalls of the trenches 42, 44. Conductor layers 56, 58 are formed inside the trenches 46, 48 as respective solid cores that are arranged interior of the portions of the dielectric layer 51 on the sidewalls of the trenches 46, 48. The portions of the dielectric layer 51 on the sidewalls of the trenches 46, 48 are disposed between the conductor layers 56, 58 and the semiconductor layer 50 on the sidewalls of the trenches 46, 48. Each of the conductor layers 52, 54 and the conductor layers 56, 58 includes a section in the semiconductor layer 12 and a section in the interlayer dielectric layers 29 of the back-end-of-line stack 28.

The conductor layers 52, 54 and the conductor layers 56, 58 are comprised of the same metal that is deposited and planarized by chemical-mechanical polishing. In an embodiment, the metal may be tungsten, which is compatible with complementary-metal-oxide-semiconductor processes. The conductor layers 52, 54 differ from conventional constructions in which the metal (e.g., aluminum) differs and is not compatible with complementary-metal-oxide-semiconductor processes, and in which poor gapfill prohibits the formation of solid cores. The conductor layers 56, 58 differ from conventional structures in which the metal is patterned by lithography and etching processes, instead of being polished and planarized. In conventional structures, the conductor layers 52, 54 and the conductor layers 56, 58 are separately formed, as are the trenches 42, 44 and the trenches 46, 48. In an embodiment, the conductor layers 52, 54, 56, 58 may comprise a bilayer of titanium and titanium nitride that lines the sidewalls of the trenches 42, 44, 46, 48 before the core metal is deposited and planarized.

The conductor layer 52 has a top surface 62 and a bottom surface 63 opposite from the top surface 62. The bottom surface 63 of the conductor layer 52 is coextensive with the metal feature 30. The conductor layer 54 has a top surface 64 and a bottom surface 65 opposite from the top surface 64. The bottom surface 65 of the conductor layer 54 is coextensive with the metal feature 31. The conductor layer 56 has a top surface 66 and a bottom surface 67 opposite from the top surface 66. The bottom surface 67 of the conductor layer 56 is coextensive with the metal feature 32. The conductor layer 58 has a top surface 68 and a bottom surface 69 opposite from the top surface 68. The bottom surface 69 of the conductor layer 58 is coextensive with the metal feature 33.

In an embodiment, the top surfaces 62, 64 may be coplanar. In an embodiment, the top surfaces 66, 68 may be coplanar. In an embodiment, the top surfaces 62, 64, 66, 68 may be coplanar. The coplanarity of the top surfaces 62, 64, 66, 68 results from the simultaneous planarization of the top surfaces 62, 64, 66, 68. In an embodiment, the bottom surfaces 63, 65 may be coplanar. In an embodiment, the bottom surfaces 67, 69 may be coplanar. In an embodiment, the bottom surfaces 63, 65, 67, 69 may be coplanar. The coplanarity of the bottom surfaces 63, 65, 67, 69 results from the metal features 30, 31, 32, 33 providing etch stops for the trenches 42, 44, 46, 48.

In an embodiment, the conductor layers 52, 54 may have equal heights H1. The equal heights H1 may result from the coplanarity of the top surfaces 62, 64 and the coplanarity of the bottom surfaces 63, 65. In an embodiment, the conductor layers 56, 58 may have equal heights H2. The equal heights H2 may result from the coplanarity of the top surfaces 66, 68 and the coplanarity of the bottom surfaces 67, 69. In an embodiment, the heights H1 of the conductor layers 52, 54 may be equal to the heights H2 of the conductor layers 56, 58.

In an embodiment, the conductor layer 56 may be connected to the conductor layer 58 by additional conductor layers 57 such that the connected conductor layers 56, 58 surround a portion of the semiconductor layer 12 in which the single-photon avalanche diode 15 is formed and other portions of the semiconductor layer 12 in which additional instances of the single-photon avalanche diode 15 may be formed. In particular and as shown in FIG. 4A, the additional conductor layers 57 may intersect and cross the conductor layers 56, 58 at various locations in a grid pattern to provide the surrounded portions of the semiconductor layer 12.

In an embodiment, the conductor layer 52 may be connected to the conductor layer 54 by additional conductor layers 53 such that the connected conductor layers 52, 54 surround portions of the semiconductor layer 12. In particular and as shown in FIG. 4A, the additional conductor layers 53 may intersect and cross the conductor layers 52, 54 at various locations in a grid pattern to provide the surrounded portions of the semiconductor layer 12.

Figure 5:
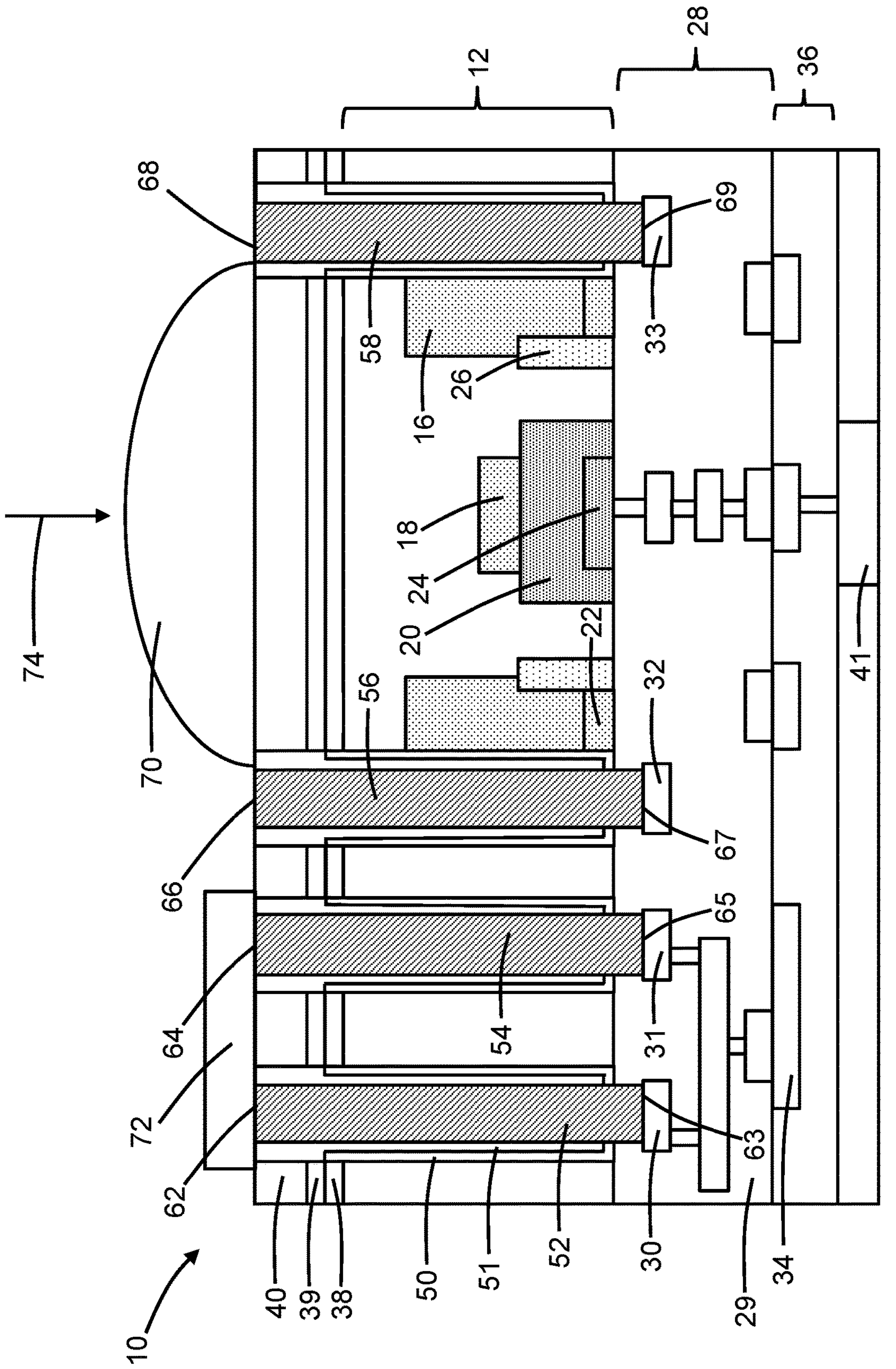
FIG. 5 is a cross-sectional view of the structure at a fabrication stage subsequent to FIG. 4.

With reference to FIG. 5 in which like reference numerals refer to like features in FIG. 4 and at a subsequent fabrication stage of the processing method, a micro-lens 70 and a bond pad 72 may be formed. In a backside-illuminated structure, the micro-lens 70 may function to focus incident light toward the device region of the single-photon avalanche diode 15. The micro-lens 70 may be comprised of a polymer, such as reflowed photoresist, or may be comprised of a dielectric material, such as silicon dioxide or silicon nitride. Backside illumination using the micro-lens 70 may boost the photon detection efficiency of the single-photon avalanche diode 15.

The bond pad 72 may be formed by depositing a metal layer and patterning the metal layer with lithography and etching processes. In an embodiment, the bond pad 72 may be comprised of a different metal from the conductor layers 52, 54. In an embodiment, the bond pad 72 may be comprised of aluminum. The conductor layers 52, 54 may be in contact with different portions of the bond pad 72. In an embodiment, the conductor layers 52, 54 may be in direct contact with different portions of the bond pad 72. The conductor layers 52, 54 connect the bond pad 72 to the metal features 30, 31 in the back-end-of-line stack 28. A wire may be attached to the bond pad 72 by a solder ball or solder bump.

The conductor layers 52, 54 define portions of an electrical connection extending from the metal features 30, 31 to the bond pad 72. The portions of the dielectric layer 51 on the sidewalls of the trenches 42, 44 electrically isolate the conductor layers 52, 54 from the semiconductor layer 12. The bond pad 72 overlaps with the conductor layers 52, 54.

The portions of the dielectric layer 51 on the sidewalls of the trenches 46, 48 and the conductor layers 56, 58 inside the trenches 46, 48 collectively define a deep trench isolation region. The conductor layers 56, 58 are electrically isolated by the portions of the dielectric layer 51 from the portion of the semiconductor layer 12 that is surrounded by the deep trench isolation region. The deep trench isolation region electrically and optically isolates the single-photon avalanche diode 15 from adjacent instances of the single-photon avalanche diode 15 in the pixel array. The isolation may reduce or prevent optical crosstalk and electrical crosstalk between adjacent single-photon avalanche diodes 15 in the pixel array.

In use, the p-n junction between the well 18 and the well 20 is reverse-biased above the breakdown voltage. The structure 10 is illuminated from the backside of the single-photon avalanche diode 15 by light 74, which is directed by the micro-lens 70 toward the device region. Incident photons are absorbed in the portion of the semiconductor layer 12 interior of the deep trench isolation region. When an incident photon is absorbed, an electron-hole pair is created, and an avalanche current is generated under the reverse bias by the creation of additional electron-hole pairs through impact ionization with atoms of the semiconductor material. The current continues to flow until the avalanche is quenched by lowering the bias to less than or equal to the breakdown voltage. The collected avalanche current provides a detectable electronic signal. In order to be able to recover for detecting another photon, the reverse bias is raised again above breakdown voltage.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value or, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:

a semiconductor layer;

a back-end-of-line stack on the semiconductor layer, the back-end-of-line stack including a plurality of interlayer dielectric layers and a first metal feature in the plurality of interlayer dielectric layers;

a photodetector including a well in the semiconductor layer;

a deep trench isolation region including a first conductor layer extending through the semiconductor layer, the deep trench isolation region surrounding the photodetector, the first conductor layer having a first bottom surface, and the first bottom surface of the first conductor layer coextensive with the first metal feature;

a bond pad; and an electrical connection including a second conductor layer extending from the bond pad through the semiconductor layer, the second conductor layer having a second bottom surface, and the second bottom surface coplanar with the first bottom surface, wherein the first metal feature is electrically floating.

2. The structure of claim 1 wherein the photodetector is a single-photon avalanche detector.

3. The structure of claim 1 wherein the electrical connection includes a first plurality of trenches having a first pitch, the deep trench isolation region includes a second plurality of trenches having a second pitch, and the second pitch is greater than the first pitch.

4. The structure of claim 1 wherein the first conductor layer and the second conductor layer comprise tungsten.

5. The structure of claim 4 wherein the bond pad comprises aluminum.

6. The structure of claim 1 wherein the back-end-of-line stack includes a second metal feature in the plurality of interlayer dielectric layers, and the second bottom surface of the second conductor layer is coextensive with the second metal feature.

7. The structure of claim 6 wherein the first metal feature and the second metal feature are disposed in the same metallization level of the back-end-of-line stack.

8. The structure of claim 6 wherein the first conductor layer has a first height, and the second conductor layer a second height that is equal to the first height.

9. The structure of claim 1 wherein the deep trench isolation region includes a first dielectric layer disposed between the first conductor layer and the semiconductor layer, and the electrical connection includes a second dielectric layer disposed between the second conductor layer and the semiconductor layer.

10. The structure of claim 9 wherein the first dielectric layer has a first thickness, and the second dielectric layer has a second thickness that is equal to the first thickness.

11. The structure of claim 1 wherein the bond pad comprises a first metal, and the second conductor layer comprises a second metal different from the first metal.

12. The structure of claim 11 wherein the bond pad comprises aluminum, and the second conductor layer comprises tungsten.

13. The structure of claim 1 wherein the first conductor layer has a first top surface, and the second conductor layer has a second top surface that is coplanar with the first top surface.

14. The structure of claim 13 wherein the first bottom surface is opposite from the first top surface, and the second bottom surface is opposite from the second top surface.

15. The structure of claim 14 wherein the first conductor layer has a first height between the first top surface and the first bottom surface, the second conductor layer has a second height between the second top surface and the second bottom surface, and the second height is equal to the first height.

16. The structure of claim 1 wherein the first conductor layer extends into the plurality of interlayer dielectric layers of the back-end-of-line stack.

17. The structure of claim 16 wherein the back-end-of-line stack includes a second metal feature in the plurality of interlayer dielectric layers, and the second conductor layer extends into the plurality of interlayer dielectric layers of the back-end-of-line stack.

18. The structure of claim 17 wherein the second bottom surface of the second conductor layer is coextensive with the second metal feature.

19. A method comprising:

forming a back-end-of-line stack on a semiconductor layer, wherein the back-end-of-line stack includes a plurality of interlayer dielectric layers and a metal feature in the plurality of interlayer dielectric layers;

forming a photodetector including a well in the semiconductor layer;

forming a deep trench isolation region including a first conductor layer extending through the semiconductor layer, wherein the deep trench isolation region surrounds the photodetector, the first conductor layer has a first bottom surface, and the first bottom surface of the first conductor layer is coextensive with the metal feature; and forming an electrical connection including a second conductor layer extending from a bond pad through the semiconductor layer, wherein the second conductor layer has a second bottom surface, the second bottom surface is coplanar with the first bottom surface, and the metal feature is electrically floating.

20. The method of claim 19 wherein the first conductor layer and the second conductor layer are concurrently planarized by chemical-mechanical polishing.

* * * * *